United States Patent
Gouda (10) Patent No.: US 9,704,980 B2
(45) Date of Patent: Jul. 11, 2017

(54) INSULATED GATE BIPOLAR TRANSISTOR AND METHOD FOR MANUFACTURING SAME

(71) Applicant: DENSO CORPORATION, Kariya, Aichi-pref. (JP)

(72) Inventor: Kenta Gouda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/034,944

(22) PCT Filed: Oct. 6, 2014

(86) PCT No.: PCT/JP2014/005076
§ 371 (c)(1),
(2) Date: May 6, 2016

(87) PCT Pub. No.: WO2015/072064
PCT Pub. Date: May 21, 2015

(65) Prior Publication Data
US 2016/0276470 A1  Sep. 22, 2016

(30) Foreign Application Priority Data
Nov. 12, 2013 (JP) ................. 2013-234260

(51) Int. Cl.
*H01L 29/739* (2006.01)
*H01L 21/265* (2006.01)
(Continued)

(52) U.S. Cl.
CPC ........ *H01L 29/7397* (2013.01); *H01L 21/265* (2013.01); *H01L 21/26506* (2013.01);
(Continued)

(58) Field of Classification Search
CPC ............ H01L 29/7397; H01L 29/0821; H01L 21/324; H01L 29/063; H01L 21/265; H01L 29/66348; H01L 21/26506
See application file for complete search history.

(56) References Cited

U.S. PATENT DOCUMENTS 6,482,681 B1    11/2002  Francis et al.
9,099,522 B2 *   8/2015  Onozawa ............ H01L 29/0661
(Continued)

FOREIGN PATENT DOCUMENTS

EP        0862220 A1   9/1998
JP        5-343667 A   12/1993
(Continued)

*Primary Examiner* — William Coleman
(74) *Attorney, Agent, or Firm* — Posz Law Group, PLC (57) ABSTRACT

An insulated gate bipolar transistor includes: a drift layer having a semiconductor substrate with N-type conductivity; a collector layer having P-type conductivity at a surface layer of the semiconductor substrate at a back surface side; and a field stop layer between the drift layer and the collector layer that has a higher impurity concentration than the drift layer. In a thickness direction of the semiconductor substrate, a lifetime control layer is arranged with a predetermined half value width by helium ion implantation; and the field stop layer is arranged with a predetermined half value width by hydrogen ion implantation. Further, a half value width region of the lifetime control layer and a half value width region of the field stop layer overlap each other.

8 Claims, 6 Drawing Sheets (51) Int. Cl.
  *H01L 29/66* (2006.01)
  *H01L 21/324* (2006.01)
  *H01L 29/06* (2006.01)
  *H01L 29/08* (2006.01)

(52) U.S. Cl.
  CPC .......... *H01L 21/324* (2013.01); *H01L 29/063* (2013.01); *H01L 29/0821* (2013.01); *H01L 29/66348* (2013.01)

(56) References Cited

U.S. PATENT DOCUMENTS

| | | |
|---|---|---|
| 9,356,115 B2 * | 5/2016 | Mizushima ....... H01L 29/66325 |
| 2001/0011745 A1 | 8/2001 | Kushida |
| 2002/0190281 A1 | 12/2002 | Francis et al. |
| 2008/0315248 A1 | 12/2008 | Tokura et al. |
| 2008/0315364 A1 | 12/2008 | Nemoto |
| 2009/0184340 A1 | 7/2009 | Nemoto et al. |
| 2009/0224284 A1 | 9/2009 | Nemoto |
| 2009/0242931 A1 | 10/2009 | Tsuzuki et al. |
| 2009/0289278 A1 | 11/2009 | Torii |
| 2011/0124160 A1 | 5/2011 | Nemoto |
| 2012/0064706 A1 | 3/2012 | Nemoto et al. |
| 2012/0313139 A1 | 12/2012 | Matsuura et al. |
| 2013/0075783 A1 | 3/2013 | Yamazaki et al. |
| 2015/0255572 A1 | 9/2015 | Matsuura et al. |

FOREIGN PATENT DOCUMENTS

| | | |
|---|---|---|
| JP | 10-74959 A | 3/1998 |
| JP | 3413021 B2 | 6/2003 |
| JP | 3952452 B2 | 8/2007 |

\* cited by examiner

INSULATED GATE BIPOLAR TRANSISTOR AND METHOD FOR MANUFACTURING SAME

CROSS REFERENCE TO RELATED APPLICATIONS

This application is a U.S. national stage application of International Patent Application No. PCT/JP2014/005076 filed on Oct. 6, 2014 and is based on Japanese Patent Application No. 2013-234260 filed on Nov. 12, 2013, the disclosures of which are incorporated herein by reference.

TECHNICAL FIELD

The present disclosure relates to an insulated gate bipolar transistor (IGBT), and a method for manufacturing the IGBT.

BACKGROUND

Patent Literature 1 discloses, for example, an IGBT which is a vertical-type power device. An IGBT can be recognized as a combined product of a MOS field effect transistor (MOS-FET) and a bipolar transistor (BJT) and is widely used as a large-current and high-voltage power device in the fields of the industry and household appliances.

As Patent Literature 1 describes, IGBTs can be roughly categorized into a punch-through (PT) type IGBT, a non-punch-through (NPT) type IGBT, and a field-stop (FS) type IGBT which is intermediate between a punch-through type and a non-punch-through type. A PT-type IGBT includes a P conductivity-type ($P^+$) collector layer made of a thick substrate, an N conductivity-type ($N^-$) drift layer formed by epitaxial growth, and an N conductivity-type ($N^+$) buffer layer between the collector layer and the drift layer. A PT-type IGBT is a high-cost device since it has a depletion layer (electric field) in contact with the collector side in an OFF state (reverse bias) and uses an epitaxial wafer. An NPT-type IGBT, on the other hand, includes an N type conductivity ($N^-$) drift layer made of a thinner substrate (silicon wafer) and a P conductivity type ($P^+$) collector layer in the back surface thereof. An NPT-type IGBT is lower in cost, higher in reliability, and only suffers a smaller number of crystal defects because it has a depletion layer not in contact with a collector layer in an OFF state and uses a floating zone wafer, the depletion layer extending from a PN junction of a P-conductivity-type layer and an N-conductivity-type drift layer in the front surface side. A FS-type IGBT includes a drift layer and a collector layer similar to those of an NPT-type IGBT, and an N-conductivity-type buffer layer called a field-stop layer (hereinafter abbreviated to a FS layer) between the drift layer and the collector layer, the N-conductivity-type ($N^-$) substrate being made thinner than the substrate of an NPT-type IGBT. In the FS-type IGBT, a depletion layer (electric field) extending from a PN junction in the front surface is in contact with a FS layer in an OFF state, and the FS layer functions as a stopper of the depletion layer. The FS-type IGBT, which can be thinner than the other two types, is becoming the mainstream of the IGBTs since the recent situation requires the IGBTs, vertical-type power devices to be thinner and thinner to attempt reduction of loss.

A FS-type IGBT can be manufactured in such manners that an N-conductivity-type dopant of phosphorus (P) or antimony (Sb) is implanted into the back surface of a thin $N^-$-conductivity-type substrate to form a FS layer. The FS layer obtained is annealed at high temperatures of 600° C. or higher to be activated, and a shallow $P^+$-conductivity type collector layer is formed in the bottom of the $N^-$-conductivity-type substrate. This method, however, has a following disadvantage. In order to reduce damage of a wafer, the structure for the front surface including a metallizing and a passivation layer is formed in the front surface and a FS layer is thereafter provided in the back surface. The presence of the metal layer in the front surface limits the temperatures of annealing after implantation of the dopant into the back surface to be lower than the temperatures (350° C. to 425° C.) of depositing the passivation layer on the surface. As a result, only a part of the dopant of phosphorus (P) or antimony (Sb) has been annealed and the degree of annealing is significantly varied in a small temperature range. In order to solve the difficulty, Patent Literature 1 describes a technique of forming a FS layer by implanting hydrogen (H) ions, and thereafter generating a shallow $P^+$-collector layer by implanting boron (B) ions, and lastly performing anneal on a wafer for 30 to 60 minutes at temperatures of 300° C. to 400° C. The annealing at the temperatures of 300° C. to 400° C. removes damages caused by the ion implantations and allows the hydrogen in the FS layer to act as a $N^+$-dopant. As has been described, when a FS layer is formed by implanting hydrogen ions, annealing at temperatures of 300° C. to 400° C. can activate the implanted hydrogen and the activated hydrogen can act as a FS layer without damaging the structure for the front surface side (metal and passivation).

PATENT LITERATURE

Patent Literature 1: JP-4128777-A

In a general IGBT, a collector current decreases after a gate is turned off. More specifically, the collector current rapidly falls to approximately 20 percent of that in an ON state and continues falling slowly. This slow degradation of the collector current is called "tail current" and is unique to the IGBTs. This collector current degradation is due to holes having been injected into a drift layer in an ON state and still remaining in the drift layer. For the purpose of reducing the tail current unique to the IGBTs to reduce loss caused by the tail current and make switching faster, various different methods have been discussed.

For instance, for PT-type and NPT-type IGBTs, a method has been examined of applying electrons or ions to a drift layer to shorten the lifetime (hereinafter abbreviated to LT) of remaining holes in the drift layer causing a tail current, thereby removing the holes in an early stage. In the meanwhile, development of FS-type IGBTs, the recent mainstream of the IGBTs, has been worked on based on the condition that the LT of remaining holes is not controlled. The condition is made because a complicated system for controlling the LT is difficult to realize in the FS-type IGBTs characterized by the smallness in thickness. Further, there is another difficulty arising from controlling the LT by applying electrons or ions to a drift layer, and that is increase in leak current accompanying generation of defects.

SUMMARY

The present disclosure relates to a FS-type IGBT with a smaller thickness and a method for manufacturing the FS-type IGBT. An object of the present disclosure is to provide a FS-type IGBT that has remaining holes with an LT which can be precisely controlled with simple configuration, has suppressed leak currents, only produces small loss, and be capable of rapid switching, and to provide a method for manufacturing the IGBT.

An IGBT according to an aspect of the present disclosure that includes: a drift layer that has a semiconductor substrate with n-type conductivity; a collector layer having p-type conductivity that is arranged on a surface layer of the semiconductor substrate at a back surface side; and a FS layer having n-type conductivity that is arranged between the drift layer and the collector layer, and that has an impurity concentration higher than the drift layer.

In addition, the FS layer is arranged to have a predetermined half width in a thickness direction of the semiconductor substrate by hydrogen (H) ion implantation, and a half-width region of the LT control layer and a half-width region of the FS layer overlap each other in the thickness direction of the semiconductor substrate.

The IGBT described above is a FS-type IGBT using a thin N conductivity type semiconductor substrate as a drift layer, being lower in cost, higher in reliability, and only suffering a smaller number of crystal defects, compared to a PT-type IGBT using an epitaxial wafer. Moreover, a FS-type IGBT can be made thinner than an NPT-type IGBT not having a FS layer. In addition, the FS layer of the IGBT is formed by implantation of hydrogen ions, and the implanted hydrogen can be activated by performing low-temperature annealing in a temperature range of 300° C. to 400° C. not affecting the structure for the front surface side, allowing the activated hydrogen to act as an N+ dopant.

Further, the IGBT is provided with an LT control layer by implantation of helium ions. Helium ions implantation can form an LT control layer locally extended in the thickness direction of the substrate and can make an LT control layer smaller than electron beam irradiation does. Furthermore, helium ions implantation can provide an LT control layer more localized in the thickness direction of the substrate than hydrogen ions implantation does. Hence, helium ions implantation is preferable for precisely forming an LT control layer in a FS-type IGBT using a thin semiconductor substrate as a drift layer. In the IGBT, the presence of the LT control layer precisely formed by helium ions implantation allows early elimination of holes remaining in the drift layer after turning-off, reduction of a tail current and loss, and rapid switching.

In the IGBT, the relation between the LT control layer formed by helium ions implantation and the FS layer formed by hydrogen ions implantation is determined so that the half-width region of the LT control layer and the half-width region of the FS layer overlap with each other. The relation between the LT control layer and the FS layer is based on the results obtained by evaluating leak currents through simulation as described below. The simulation shows that a large leak current with a fixed magnitude generates when the half-width region of the FS layer formed by hydrogen ions implantation does not overlap with that of the LT control layer formed by helium ions implantation, and that the leak current starts to reduce rapidly when the half-width region of the FS layer overlaps with that of the LT control layer to a degree that the boundary at the front surface side of the FS layer defining the half-width region of the FS layer enters the half-width region of the LT control layer. When the overlapping area gets larger until the boundary at the front surface side of the FS layer becomes coincident with the boundary at the front surface side of the LT control layer defining the half-width region of the LT control layer and the half-width region of the LT control layer is just contained in the half-width region of the FS layer, the leak current reduces to approximately 25% of the leak current when there is no overlapping area. When the boundary at the front surface side of the FS layer is nearer to the front surface than the boundary at the front surface side of the LT control layer is by at least a half of the half-width of the LT control layer, the leak current becomes 0.

For manufacturing the IGBT, a method including the following steps is desirably employed.

First, the structure for the front surface side of an N-conductivity-type semiconductor substrate is formed and then the semiconductor substrate is grounded and polished from the back surface to have a predetermined thickness. Next, as a first step of forming the structure for the back surface side of the semiconductor substrate, a collector layer is formed in the back surface of the semiconductor substrate (collector layer formation step). In this collector layer formation step, ions of a P-conductivity-type impurity such as boron (B) are implanted into the back surface of the substrate and the back surface is annealed with laser. After the collector layer formation step, helium ions are implanted into the back surface of the semiconductor substrate so that an LT control layer is formed (first ion-implantation step). After the first ion-implantation step, the semiconductor substrate is annealed (first annealing step). After the first annealing step, hydrogen ions are implanted into the back surface of the semiconductor substrate to form a FS layer (second ion-implantation step). After the second ion-implantation step, the semiconductor substrate is annealed again (second annealing step) and the back surface of the semiconductor substrate is metalized so that a collector electrode is formed.

The steps described above complete the manufacturing of the IGBT.

The temperature range for the first and second annealing steps are preferably from 300° C. to 425° C., both inclusive, not affecting the structure for the front surface side, and are more preferably from 360° C. to 400° C., both inclusive. It is thus desirable that the first and second annealing steps be performed in the same temperature range. Therefore, performing anneal on the ion-implanted layers at once in one annealing step after carrying out the first ion-implantation step of implanting helium ions and the second ion-implantation step of implanting hydrogen ions in succession is an option to select. It turned out, however, that this option confronts a difficulty in loss of LT reduction effects of the LT control layer when simultaneously annealing the LT control layer, which is the helium-implanted layer formed in the first ion-implantation step, and the FS layer, which is the hydrogen-implanted layer formed in the second ion-implantation step. Hence, the method according to the present invention separately performs the first annealing step after the first ion-implantation step of implanting helium ions and the second annealing step after the second ion-implantation step of implanting hydrogen ions.

As described above, the present invention aims to achieve a FS-type IGBT that can be made thinner, has remaining holes with an LT which can be precisely controlled with simple configuration, has suppressed leak currents, only produces small loss, and be capable of rapid switching, and to achieve a method for manufacturing the IGBT.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

An embodiment for carrying out the disclosure will be described below with reference to the drawings.

Figure 1:
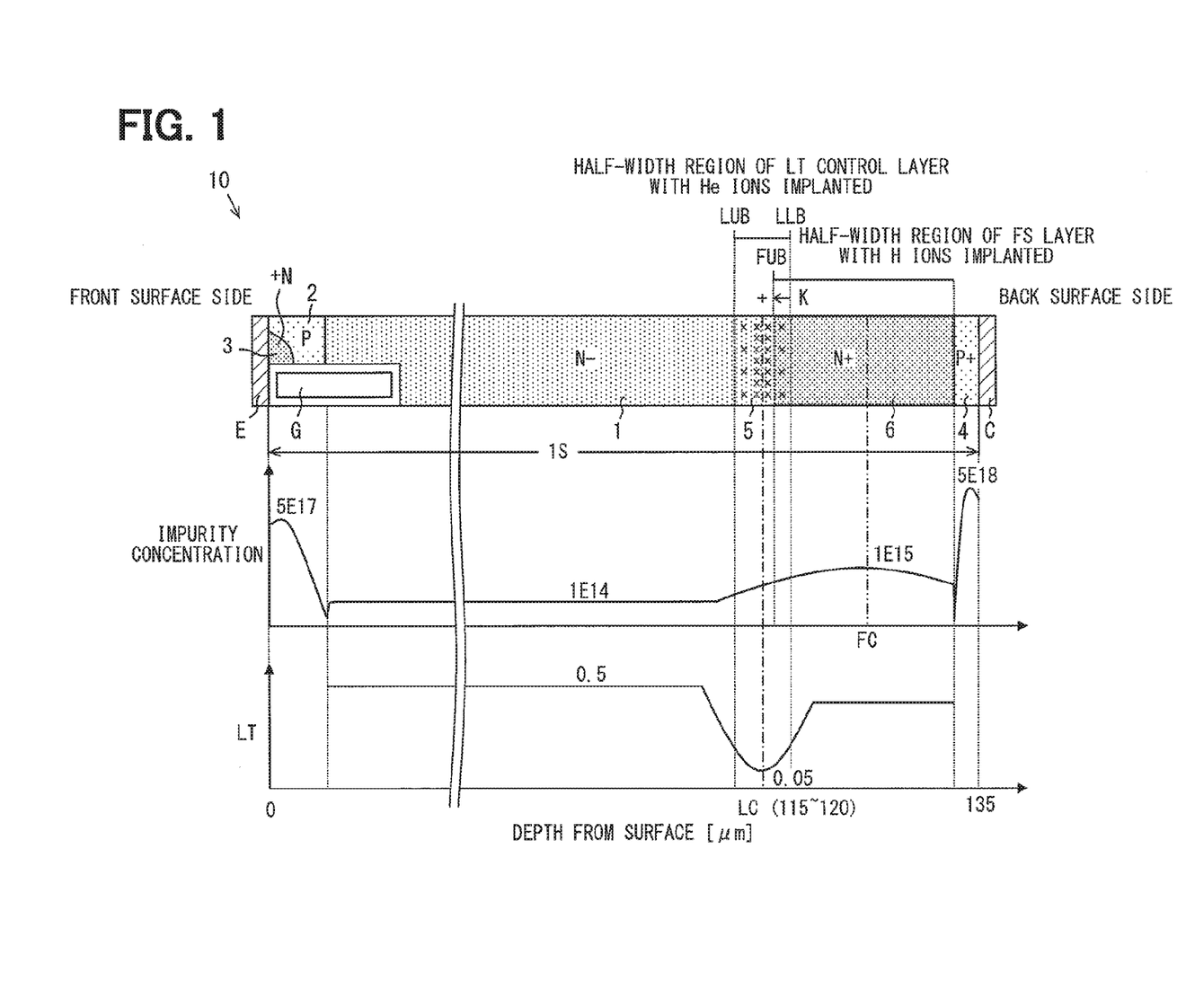
FIG. 1 is a diagram schematically showing a cross-sectional view of an IGBT, an example of an IGBT according to an embodiment of the present disclosure.

FIG. 1 is a diagram schematically showing a cross-sectional view of an IGBT 10, an example of an IGBT according to an embodiment of the present disclosure. FIG. 1 employs the same horizontal scale as the cross-sectional view does and a vertical scale of logarithm, and schematically shows the impurity concentration distribution and the LT distribution of remaining holes in the layers of the IGBT 10. Note that a typical maximum impurity concentration of each layer is represented by codes such as 1E15 ($1 \times 10^{15}$/cm$^3$) in the graph of the impurity concentration distribution and a typical minimum LT value of each layer is represented by numbers such as 0.05 (µs) in the graph of the LT distribution.

The IGBT 10 in FIG. 1 is a FS-type IGBT. Specifically, the IGBT 10 includes a drift layer 1 made of an N conductivity type (N$^-$) semiconductor substrate 1S, a P conductivity type (P$^+$) collector layer 4 formed on the back surface of the semiconductor substrate 1S, and a FS layer 6 between the drift layer 1 and the collector layer 4. The FS layer 6 has an N conductivity type (N$^+$) and is higher in the impurity concentration than the drift layer 1. On the back surface of the semiconductor substrate 1S, a collector electrode C connecting to the collector layer 4 is formed.

In the IGBT 10 in FIG. 1, a P-conductivity-type (P) layer 2 is formed as a channel formation layer in the front surface of the semiconductor substrate 1S, and an N-conductivity-type (N$^+$) region 3 is selectively formed as an emitter region in the surface of the P-conductivity-type layer 2. The IGBT 10 in FIG. 1 is a trench-gate type capable of increasing the cell density and reducing the on-state voltage and having an insulating trench gate G being in contact with the N-conductivity-type region 3 and penetrating the P-conductivity-type layer 2. The IGBT 10 in FIG. 1 further includes, on the front surface of the semiconductor substrate 1S, an emitter electrode E connecting to both the N-conductivity-type region 3 and the P-conductivity-type layer 2.

Moreover, the IGBT 10 in FIG. 1 includes an LT control layer 5 formed by helium (He) ions implantation in the thickness direction of the semiconductor substrate 1S to have a predetermined half width. The LT control layer 5 contains implanted helium in the maximum concentration at a cross-sectional position LC of the LT control layer 5 indicated by an alternate long and short dash line in FIG. 1, which corresponds to a position where the LT becomes minimum. The position LC where the implanted helium is contained in the maximum concentration will be hereinafter referred to as the "helium concentration maximum position LC". Further, cross-sectional positions LUB and LLB at both ends of the LT control layer 5 pointed by dotted lines respectively indicate the positions of LT control layer 5 near the front surface and the back surface containing implanted helium in a concentration half the peak value in a Gaussian distribution. The positions LUB and LLB correspond to the positions where the LT becomes twice the minimum value in the front surface side and the back surface side, respectively. The cross-sectional positions LUB and LLB defining the half-width region of the LT control layer 5 will be hereinafter referred to as the "LT control layer front surface side boundary LUB" and "LT control layer back surface side boundary LLB", respectively. It is to be noted that although the thickness of the half-width region of the LT control layer 5 can be calculated from the range in each material for the helium-ions implantation energy, it is also obtainable by measuring a spreading resistance after the ion implantation.

In the IGBT 10 in FIG. 1, the FS layer 6 is formed to have a predetermined half width by hydrogen (H) ions implantation. The FS layer 6 in FIG. 1 contains implanted hydrogen in the maximum concentration at a cross-sectional position FC of the FS layer 6 indicated by an alternate long and two short dashes line. The position FC where the implanted hydrogen is contained in the maximum concentration will be hereinafter referred to as the "hydrogen concentration maximum position FC". Further, a cross-sectional position FUB at the edge of the FS layer 6 near the front surface pointed by a dotted line indicates the position of the FS layer 6 near the front surface containing implanted hydrogen in a concentration half the peak value in a Gaussian distribution. The cross-sectional position FUB defining the half-width region of the FS layer 6 will be hereinafter referred to as the "FS layer front surface side boundary FUB".

In the IGBT 10 in FIG. 1, the half-width regions of the LT control layer 5 and the FS layer 6 overlap with each other. To represent the degree of overlapping of the half-width regions of the LT control layer 5 and the FS layer 6, a variable K is employed as indicated by an arrow in the drawing. The variable K is a value indicating the position of the FS layer front surface side boundary FUB of the FS layer 6 with respect to the LT control layer back surface side boundary LLB of the LT control layer 5. When the FS layer front surface side boundary FUB is nearer to the front surface than the LT control layer back surface side boundary LLB is, the variable K is a positive number and the respective half-width regions of the LT control layer 5 and the FS layer 6 overlap with each other. On the other hand, when the FS layer front surface side boundary FUB is nearer to the back surface than the LT control layer back surface side boundary LLB is, the variable K is a negative number and the respective half-width regions of the LT control layer 5 and the FS layer 6 do not overlap with each other.

The IGBT in FIG. 1 is a FS-type IGBT using a thin N conductivity-type semiconductor substrate 1S as a drift layer 1, being lower in cost, higher in reliability, and only suffering a smaller number of crystal defects, compared to a PT-type IGBT using an epitaxial wafer. Moreover, a FS-type IGBT can be made thinner than an NPT-type IGBT not having a FS layer 6. In addition, the FS layer 6 of the IGBT 10 is formed by implantation of hydrogen ions, and the implanted hydrogen can be activated by performing low-temperature annealing in a temperature range of 300° C. to 400° C. not affecting the structure for the front surface side, allowing the activated hydrogen to act as an N$^+$ dopant.

Further, the IGBT 10 in FIG. 1 is provided with the LT control layer 5 by implantation of helium ions. Helium ions implantation can form the LT control layer 5 locally extended in the thickness direction of the substrate as shown in the drawing, and can make the LT control layer 5 smaller than electron beam irradiation does. Furthermore, helium ions implantation can provide the LT control layer 5 more localized in the thickness direction of the substrate than hydrogen ions implantation does. For example, if ions of hydrogen and helium are separately implanted into silicon (Si) with an energy of 17 MeV, a Gaussian distribution with a half width of approximately 3.5 μm is observed when helium ions are implanted while a Gaussian distribution with a half width of approximately 75 μm is observed when hydrogen ions are implanted. Further, a defect generation rate of approximately 95/ion is obtained when hydrogen ions are implanted while a defect generation rate of approximately 275/ion is obtained when helium ions are implanted. Helium ions implantation is therefore preferable for precisely forming an LT control layer in a FS-type IGBT using a thin semiconductor substrate as a drift layer, as in the case of the IGBT 10 in FIG. 1. In the IGBT 10, the presence of the LT control layer 5 precisely formed by helium ions implantation allows early elimination of holes remaining in the drift layer 1 after turning-off, reduction of a tail current and loss, and rapid switching.

In the IGBT 10 in FIG. 1, the relation between the LT control layer 5 formed by helium ions implantation and the FS layer 6 formed by hydrogen ions implantation is determined so that the half-width region of the LT control layer 5 and the half-width region of the FS layer 6 overlap with each other. In other words, the relation is formed so that the variable K in the drawing takes a positive number. The relation between the LT control layer 5 and the FS layer 6 is based on the results described below obtained by evaluating a leak current through simulation.

Figure 2:
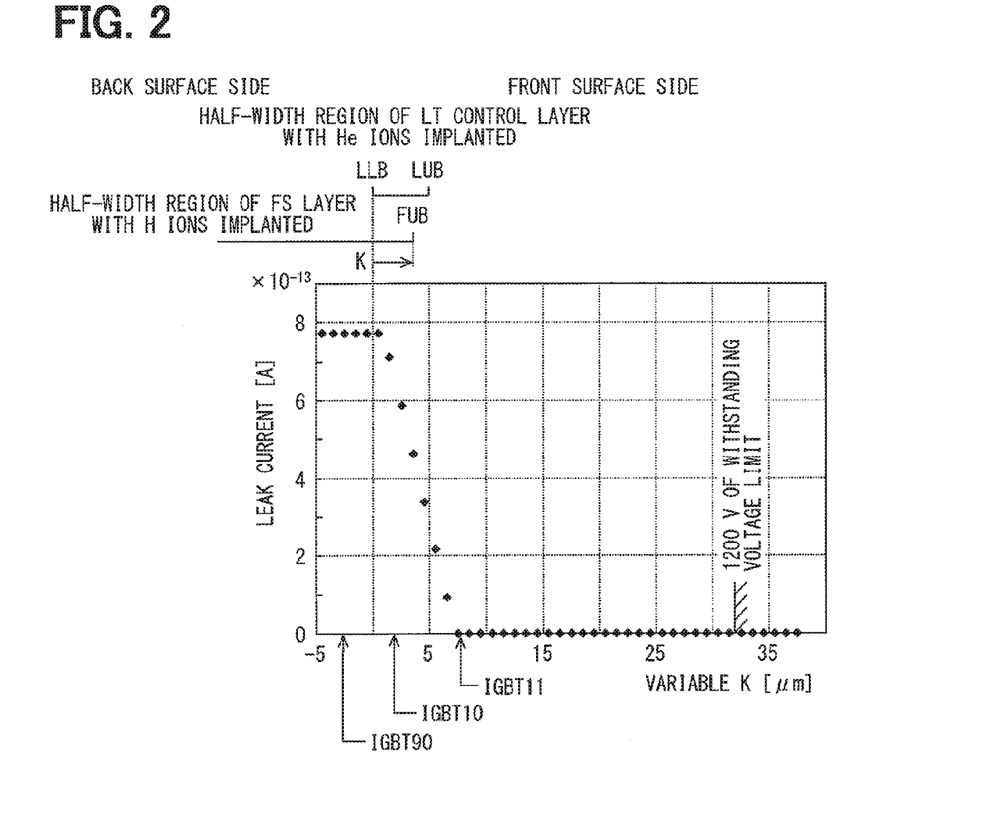
FIG. 2 is a diagram illustrating results of simulating a leak current in an OFF state with respect to a variable K indicative of the degree of overlapping of the respective half-width regions of an LT control layer and a FS layer.

FIG. 2 is a diagram illustrating the results of simulating a leak current in an OFF state with respect to the variable K indicative of the degree of overlapping of the respective half-width regions of the LT control layer 5 and the FS layer 6. The front surface side and the back surface side in FIG. 1 are reversed in FIG. 2.

The IGBT 10 in FIG. 1 is designed to have a withstanding voltage of 1200 V and use a 135-μm-thick semiconductor substrate 1S. The simulation of FIG. 2 is carried out under the conditions that the helium concentration maximum position LC is 120 μm apart from the front surface and the half width region of the LT control layer 5 is 5 μm. Further, the variable K is varied by changing the hydrogen concentration maximum position FC (depth from the back surface). Moreover, the Gaussian distribution of the impurity concentration for the FS layer 6 is changed responding to variations in the hydrogen concentration maximum position FC so that the total amount of the impurity in the FS layer 6 required for maintaining the withstanding voltage of 1200 V will not change.

In the simulation of FIG. 2, a large leak current with a fixed magnitude generates when the half-width region of the FS layer 6 formed by hydrogen ions implantation does not overlap with that of the LT control layer 5 formed by helium ions implantation (K<0).

Figure 3:
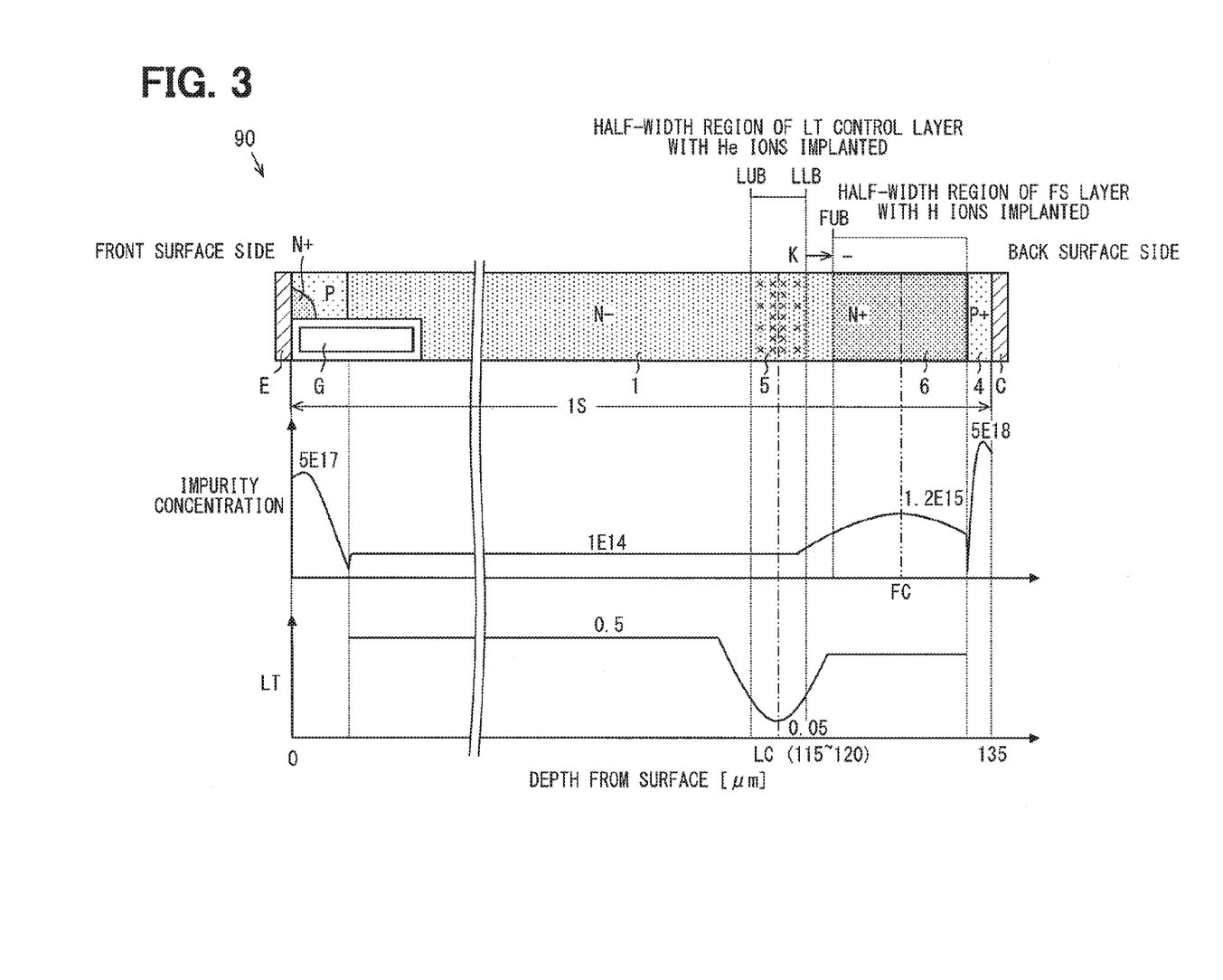
FIG. 3 is a diagram illustrating an example of an IGBT when the variable K is a negative number.

FIG. 3 is a diagram illustrating an example of an IGBT 90 with a variable K of a negative number. The variable K for the IGBT 90 in FIG. 3 is shown by an arrow in FIG. 2 as well.

In the IGBT 90 in FIG. 3, the half-width region of the FS layer 6 does not overlap with that of the LT control layer 5 and the half-width region of the LT control layer 5 is in the drift layer 1. The IGBT 90 in that state generates a leak current with a fixed magnitude as large as approximately $8 \times 10^{-13}$ A as shown in FIG. 2.

The leak current starts to decrease rapidly as shown in FIG. 2 when the half-width region of the FS layer 6 overlaps with that of the LT control layer 5 (K>0) to a degree that the FS layer front surface side boundary FUB enters the half-width region of the LT control layer 5, as in the IGBT 10 in FIG. 1. When the overlapping area gets larger until the FS layer front surface side boundary FUB matches with the LT control layer front surface side boundary LUB and the half-width region of the LT control layer 5 is just contained in the half-width region of the FS layer 6, the leak current reduces to approximately 25% of that when there is no overlapping area.

Further, when the FS layer front surface side boundary FUB is nearer to the front surface than the LT control layer front surface side boundary LUB is by at least a half of the half width of the LT control layer 5 (K≥1.5×[half width of LT control layer 5]), the leak current becomes 0 as in FIG. 2.

Figure 4:
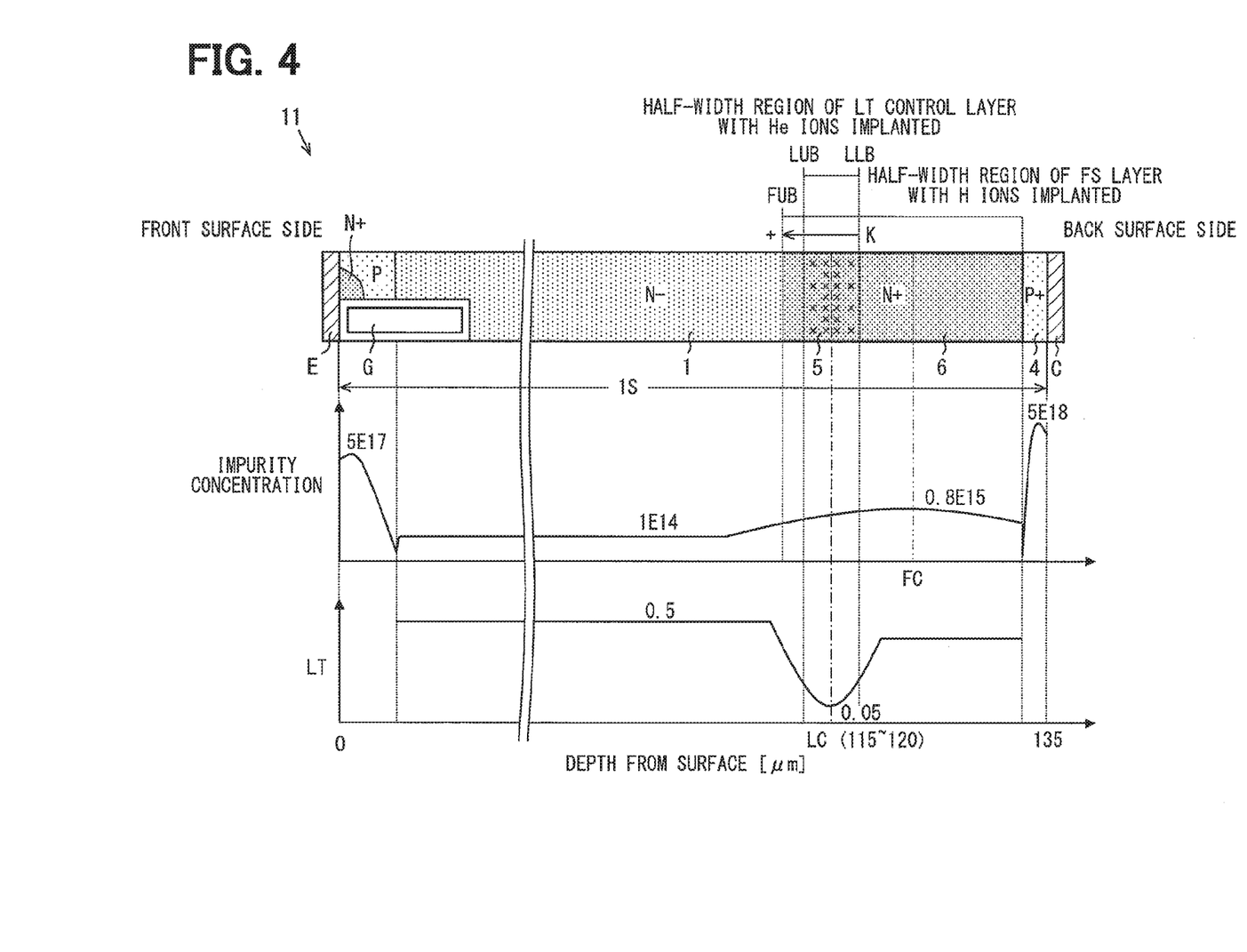
FIG. 4 is a diagram illustrating an example of an IGBT when the variable K is 1.5×[half width of LT control layer]

FIG. 4 is a diagram illustrating an example of the IGBT 11 with a variable K of 1.5×[half width of LT control layer 5]. The variable K for the IGBT 11 in FIG. 4 is shown by an arrow in FIG. 2.

In the IGBT 11 in FIG. 4, the half-width region of the LT control layer 5 is set to be 5 μm. Accordingly, when the variable K is 7.5 μm, the helium ions implanted to form the LT control layer 5 and the lattice defects generated in the formation are mostly contained in the half-width region of the FS layer 6. The IGBT 11 in that state has a leak current of 0, as shown in FIG. 2.

The relation between the overlapping state of the LT control layer to the FS layer and the leak current, which is found from the simulation results in FIG. 2, is as follows. In the FS-type IGBT, a depletion layer (electric field) extending from a PN junction of the p-conductivity-type layer and the n-conductivity-type layer in the front surface side is in contact with the FS layer in an OFF state (reverse bias), and the FS layer functions as a stopper of the depletion layer. A lattice defect in the LT control layer generated by helium ions implantation serves as a generation center and a recombination center of a pair of electron and hole. Accordingly, as in the IGBT 90 in FIG. 3, when the FS layer is provided in the drift layer so as not to overlap with the LT control layer, an electron and a hole in a pair generated at the generation center of the LT control layer are drawn to electrodes of two different poles, respectively, in the electric field in the depletion layer, and become a leak current. On the other hand, when the half-width region of the FS layer overlaps with the half-width region of the LT control layer as in the IGBT 10 in FIG. 1, no depletion layer (electric field) is formed in the overlapping area. Accordingly, an electron and a hole in a pair generated in the overlapping part of the LT control layer recombine and disappear in no time without being drawn to electrodes of two different poles, respectively, in the electric field. From these two cases, it can be said that the larger the overlapping area is, the more a leak current reduces. Moreover, when the FS layer front surface side boundary is nearer to the front surface than the LT control layer front surface side boundary is by at least a half of the half width of the LT control layer as in the IGBT 11 in FIG. 4, the lattice defects of the LT control layer are mostly contained in the half-width region of the FS layer and the leak current becomes 0.

The IGBTs 10 and 11 designed as illustrated in FIGS. 1 and 4 are each a FS-type IGBT that can be made thinner, have remaining holes with an LT which can be precisely controlled with simple configuration, have suppressed leak currents, only produce small loss, and are capable of rapid switching.

Further, a FS-type IGBT and an NPT-type IGBT using an N-conductivity-type semiconductor substrate as a drift layer are more suited for applications which require high withstanding voltage than a PT-type IGBT using a thin N-conductivity-type epitaxial layer as a drift layer is. The IGBTs 10 and 11 illustrated in FIGS. 1 and 4 are therefore desirable for use in a driving circuit for a vehicle motor where low cost and high withstanding voltage are demanded.

Figure 5:
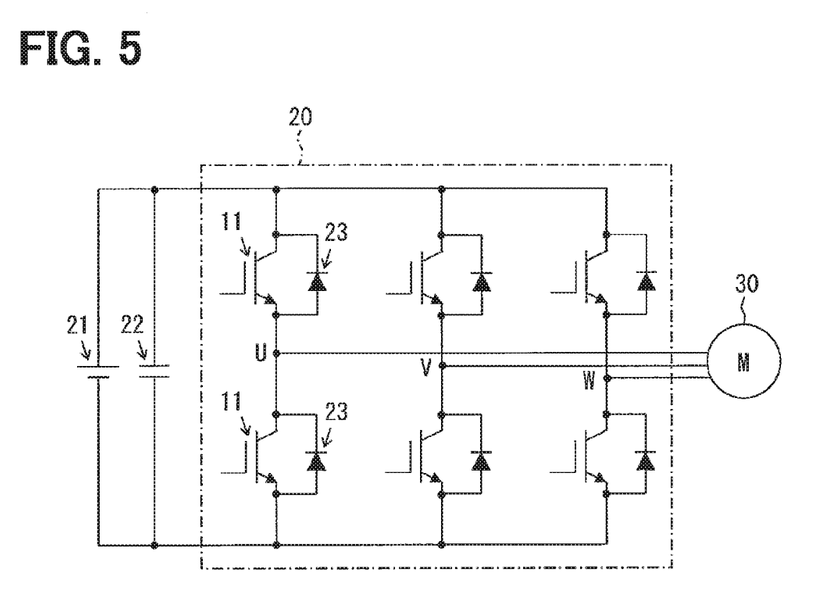
FIG. 5 is a circuit diagram illustrating an electric power converter provided with a three-phase inverter circuit driving a three-phase AC motor, as an example of the IGBT when applied to a driving circuit of a vehicle motor.

FIG. 5 is a circuit diagram illustrating an electric power converter provided with a three-phase inverter circuit 20 driving a three-phase AC motor 30, as an example of the IGBT when applied to a driving circuit of a vehicle motor.

The inverter circuit 20, which is surrounded by an alternate long and short dash line in FIG. 5, converts voltages and currents from a direct-current power supply 21 and supplies electric power to the three-phase AC motor 30 as a load. The direct-current power supply 21 and a smoothing capacitor 22 are connected in parallel to the inverter circuit 20, and a fixed power source voltage is supplied with a ripple at switching being reduced and the influence of noise being suppressed. The inverter circuit 20 includes a parallel arrangement of three phases U, V, and W, each phase having two SW elements at an upper arm and a lower arm connected in series. For the SW elements, the IGBTs 10 and 11 in FIGS. 1 and 4 are used. Further, the SW elements are connected in an inverse-parallel manner to flywheel diodes (hereinafter abbreviated to the FWD) 23 for reflux, respectively. Moreover, a three-phase alternating current is generated by controlling ON and OFF of the SW elements at the upper and lower arms of each phase in a predetermined order, so that the three-phase AC motor 30 is driven.

When the FS-type IGBT is used for the high-voltage inverter circuit driving the vehicle motor as shown in FIG. 5, a withstanding voltage of 600 V to 1800 V is required, and the withstanding voltages in that range can be realized by a semiconductor substrate (N-conductivity-type drift layer) with a thickness ranging from 50 μm to 180 μm, both inclusive. FIG. 2 indicates the upper limit of the variable K necessary for ensuring a withstanding voltage not lower than 1200 V, which is 32 μm for the IGBTs 10 and 11 using the 135-μm-thick semiconductor substrate 1S.

Next, a method for manufacturing the IGBT according to an embodiment of the present disclosure will be described.

Figure 6:
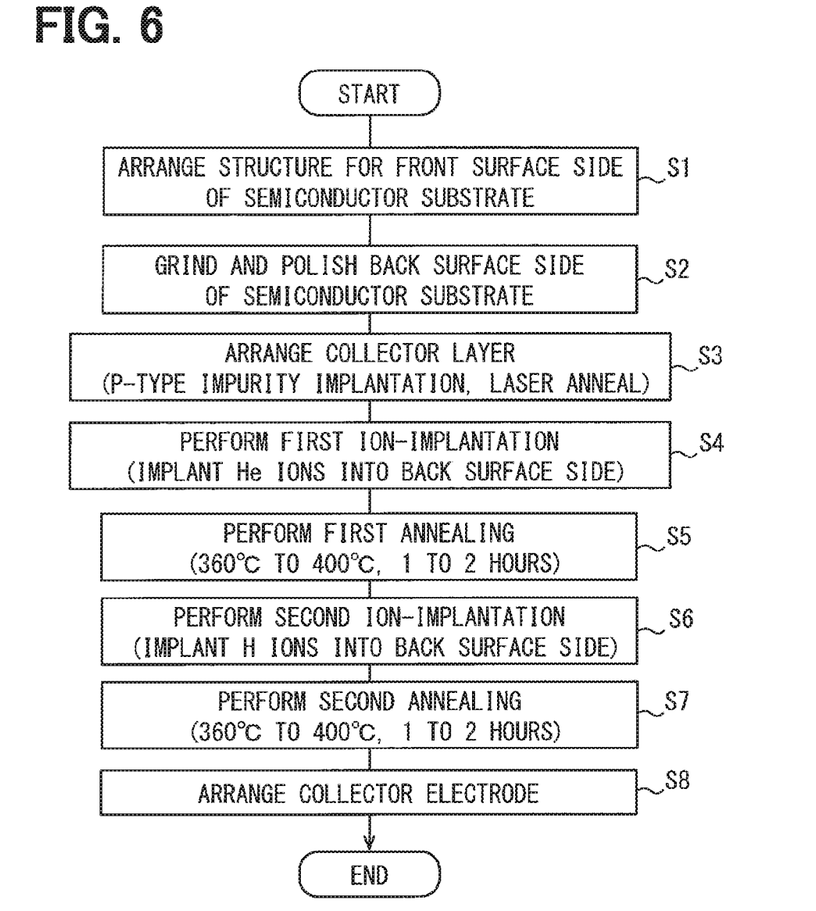
FIG. 6 is a flow chart illustrating a desirable process for manufacturing the IGBTs.

FIG. 6 is a flow chart illustrating a desirable process for manufacturing the IGBTs 10 and 11 in FIGS. 1 and 4. The steps in FIG. 6 for manufacturing the IGBTs 10 and 11 will be described with reference to the structure in FIG. 1.

As shown in Step S1 of FIG. 6, the P-conductivity-type layer 2, the N-conductivity-type layer 3, the insulating trench gate G, and the emitter electrode E are formed for the front surface side of the N conductivity type (N⁻) semiconductor substrate. After the formation of the structure for the front surface side, the semiconductor substrate 1S is ground and polished from the back surface thereof so that the semiconductor substrate has a predetermined thickness, as shown in the next step, S2. The semiconductor substrate 1S has a thickness ranging from approximately 75 μm to 90 μm when the withstanding voltage is 900 V, and has a thickness ranging from approximately 125 μm to 135 μm when the withstanding voltage is 1200 V.

After that, the collector layer 4 is formed in the back surface of the semiconductor substrate 1S as a first step of forming the structure in the back surface side, as shown in the collector layer formation step of Step S3. In the collector layer formation step, ions of a P-conductivity-type impurity such as boron (B) are implanted and the back surface is annealed with laser. If the FWD 23 illustrated in FIG. 5 is to be formed in the semiconductor substrate 1S, ions of an N-conductivity-type impurity to be a cathode and the P-conductivity-type impurity of the IGBT are selectively implanted and the back surface is annealed with laser.

After the collector layer formation step, helium (He) ions are implanted into the back surface of the semiconductor substrate 1S so that the LT control layer 5 will be formed, as shown in the first ion-implantation step of Step S4 in FIG. 6. The helium irradiation amount is approximately $(1-3) \times 10^{11}/cm^{-2}$. After the first ion-implantation step, the semiconductor substrate 1S is annealed at temperatures of 360° C. to 400° C. for 1 to 2 hours, as shown in the first annealing step of Step S5.

After the first annealing step, hydrogen (H) ions are implanted into the back surface of the semiconductor substrate 1S so that the FS layer 6 is formed, as shown in the second ion-implantation step of Step S6. The hydrogen irradiation amount is approximately $1 \times (10^{13}-10^{14})cm^{-2}$. After the second ion-implantation step, the semiconductor substrate 1S is annealed again at temperatures of 360° C. to 400° C. for 1 to 2 hours, as shown in the second annealing step of Step S7.

Lastly, the back surface of the semiconductor substrate 1S is metalized so that the collector electrode C is formed, as shown in Step S8 of FIG. 6.

The steps set forth above can complete the manufacturing of the IGBTs 10 and 11.

In the method for manufacturing the IGBTs 10 and 11 in FIG. 6, the temperature range for annealing in the first and second annealing steps S5 and S7 are preferably from 300° C. to 425° C., both inclusive, not affecting the structure for the front surface side, and are more preferably from 360° C. to 400° C., both inclusive. It is thus desirable that the first and second annealing steps S5 and S7 be performed in the same temperature range. Therefore, annealing the ion-implanted layers at once in one annealing step after successively carrying out the first ion-implantation step of implanting helium (He) ions and the second ion-implantation step of implanting hydrogen (H) ions seems to be a possible option. It has turned out, however, that this option confronts a difficulty in loss of LT reduction effects of the LT control layer when simultaneously annealing the LT control layer, which is the helium-implanted layer formed by the first ion-implantation step, and the FS layer, which is the hydrogen-implanted layer formed by the second ion-implantation step. Hence, the method in FIG. 6 separately performs the first annealing step S5 after the first ion-implantation step S4 of implanting helium ions and the second annealing step S7 after the second ion-implantation step S6 of implanting hydrogen ions.

Possible reasons will be stated below for the disappearance of the LT reduction effects of the LT control layer resulting from simultaneously annealing the LT control layer as the helium-implanted layer and the FS layer as the hydrogen-implanted layer.

The first annealing step after the first ion-implantation step does not repair lattice defects generated by helium implantation, and only removes unstable defects and stabilizes lattice defects which function as so-called LT killers of remaining holes to be fixed. The second annealing step after the second ion-implantation step, on the other hand, repairs lattice defects generated by hydrogen implantation and allows implanted hydrogen to act as a donor.

If the LT control layer 5 and the FS layer 6 are to be formed to overlap with each other as in the IGBTs 10 and 11, performing the first ion-implantation step of implanting helium ions and the second ion-implantation step of implanting hydrogen ions in a row leads to the situation where unfixed lattice defects including unstable ones generated by the helium ions implantation are present in the LT control layer obtained by the first ion-implantation step and the hydrogen implanted in the second ion-implantation step exists around the lattice defects. Annealing both the LT control layer and the FS layer in that state at once presumably repairs not only the lattice defects of the FS layer generated by the hydrogen implantation but also the lattice defects of the LT control layer generated earlier than the lattice defects of the FS layer by the helium implantation, and this makes the LT reduction effects of the LT control layer disappear.

As described above, the present disclosure aims to provide a FS-type IGBT that can be made thinner, has remaining holes with an LT which can be precisely controlled with simple configuration, has suppressed leak currents, only produces small loss, and be capable of rapid switching, and to provide a method for manufacturing the IGBT.

The invention claimed is:

1. An insulated gate bipolar transistor, comprising:
   a drift layer that has a semiconductor substrate with N-type conductivity;
   a collector layer having P-type conductivity that is arranged on a surface layer of the semiconductor substrate at a back surface side;
   a field stop layer (FS layer) having the N-type conductivity that is arranged between the drift layer and the collector layer, and that has an impurity concentration higher than the drift layer, the FS layer is arranged to have a predetermined half width in a thickness direction of the semiconductor substrate by hydrogen ion implantation;
   a lifetime control layer (LT control layer) is arranged to have a predetermined half width in the thickness direction of the semiconductor substrate by helium ion implantation; and
   a half-width region of the LT control layer and a half-width region of the FS layer overlap each other in the thickness direction of the semiconductor substrate, the half-width region of the LT control layer is included in the half-width region of the FS layer, and
   an FS layer front surface side boundary for defining the half-width region of the FS layer is arranged closer to a front surface of the semiconductor substrate in comparison with an LT control layer front surface side boundary for defining the half-width region of the LT control layer by at least a half of the predetermined half width of the LT control layer.

2. The insulated gate bipolar transistor according to claim 1, wherein the predetermined half width of the LT control layer is 5 pm.

3. The insulated gate bipolar transistor according to claim 1, wherein the semiconductor substrate has a thickness in a range from 50 pm to 180 pm.

4. The insulated gate bipolar transistor according to claim 1, wherein the insulated gate bipolar transistor is a trench-gate type that has an insulating
   trench gate penetrating a P-conductivity-type layer arranged at a surface layer of the semiconductor substrate at a front surface side.

5. The insulated gate bipolar transistor according to claim 1, wherein the insulated gate bipolar transistor is used for an inverter circuit driving a vehicle motor.

6. A method for manufacturing an insulated gate bipolar transistor according to claim 1, the method comprising:
   forming a collector layer having P-type conductivity on a surface layer of a semiconductor substrate with N-type conductivity at a back surface side;
   implanting helium ions into the back surface of the semiconductor substrate to form a lifetime control layer (LT control layer) after the forming of the collector layer;
   annealing the semiconductor substrate after the implanting of helium ions;
   implanting hydrogen ions into the back surface of the semiconductor substrate to form a field stop layer after the annealing of the semiconductor substrate after the implanting of helium ions; and
   annealing the semiconductor substrate after the implanting of hydrogen ions.

7. The method for manufacturing the insulated gate bipolar transistor according to claim 6,
   wherein the annealing of the semiconductor substrate after the implanting of helium ions and the annealing of the semiconductor substrate after the implanting of hydrogen ions are performed at a temperature in a range from 300° C. to 425° C.

8. The method for manufacturing the insulated gate bipolar transistor according to claim 7,
   wherein the annealing of the semiconductor substrate after the implanting of helium ions and the annealing of the semiconductor substrate after the implanting of hydrogen ions are performed at a temperature in a range from 360° C. to 400° C.

* * * * *